United States Patent
Hammond et al.

(10) Patent No.: US 8,433,027 B2
(45) Date of Patent: Apr. 30, 2013

(54) DIGITAL CONTROLLER FOR AUTOMATIC RATE DETECTION AND TRACKING OF AUDIO INTERFACE CLOCKS

(75) Inventors: Paul Hammond, Linlithgow (GB); David Eke, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 740 days.

(21) Appl. No.: 12/592,598

(22) Filed: Nov. 30, 2009

(65) Prior Publication Data

US 2011/0087347 A1 Apr. 14, 2011

Related U.S. Application Data

(60) Provisional application No. 61/278,645, filed on Oct. 8, 2009.

(51) Int. Cl.
*H03L 7/08* (2006.01)
(52) U.S. Cl.
USPC .......................................... 375/376; 327/156
(58) Field of Classification Search .................. 375/327, 375/374, 376; 327/147, 148, 151, 156, 157, 327/160; 713/400, 500, 503, 600
See application file for complete search history.

(56) References Cited

U.S. PATENT DOCUMENTS

| | | | | |
|---|---|---|---|---|
| 5,703,539 | A | * | 12/1997 | Gillig et al. ..................... 331/16 |
| 5,790,615 | A | | 8/1998 | Beale et al. |
| 6,201,486 | B1 | | 3/2001 | Chan et al. |
| 7,499,106 | B1 | | 3/2009 | Gudmunson et al. |
| 2003/0007273 | A1 | * | 1/2003 | Haraguchi et al. .............. 360/51 |
| 2006/0166627 | A1 | | 7/2006 | Crawley |
| 2008/0075152 | A1 | | 3/2008 | Melanson |
| 2008/0198958 | A1 | | 8/2008 | Shin |

OTHER PUBLICATIONS

European Search Report 10392003.90-2206/2378666 Mail date—May 3, 2012.

* cited by examiner

*Primary Examiner* — Young T. Tse
(74) *Attorney, Agent, or Firm* — Saile Ackerman LLC; Stephen B. Ackerman

(57) ABSTRACT

Systems and methods to achieve a digital audio interface having automatic rate detection and tracking of digital audio streams have been achieved. The system comprises a digital controller working in conjunction with an analog phase-locked loop (PLL). It removes the need to know or communicate in advance the rate at which the interface will be operating, so allowing asynchronous switching between different audio streams. The digital controller acts as a phase-lock loop by modifying the feedback divide ratio of the PLL in order to minimize the phase error between the device clock and an arbitrary audio interface clock.

13 Claims, 4 Drawing Sheets

FIG. 3

| Current I2S rate | New I2S rate | | | | | | |
|---|---|---|---|---|---|---|---|
| | 8.0kHz | 11.025 or 12.0kHz | 16.0kHz | 22.05 or 24.0kHz | 32.0kHz | 44.1 or 48.0kHz | 88.2 or 96.0kHz |
| 8.0kHz | | 142-209 | 105-141 | 75-104 | 53-74 | 31-52 | <31 |
| 11.025 or 12.0kHz | >209 | | 158-213 | 107-157 | 79-106 | 47-78 | <47 |
| 16.0kHz | >315 | 214-315 | | 142-209 | 105-141 | 62-104 | <62 |
| 22.05 or 24.0kHz | >420 | 285-420 | 210-284 | | 158-213 | 94-157 | <94 |
| 32.0kHz | >630 | 427-630 | 316-426 | 214-315 | | 125-209 | <125 |
| 44.1 or 48.0kHz | >841 | 570-841 | 421-569 | 285-420 | 210-284 | | <187 |
| 88.2 or 96.0kHz | >1262 | 854-1262 | 631-853 | 427-630 | 316-426 | 187-315 | |
| | >2525 | 1709-2525 | 1263-1708 | 854-1262 | 631-853 | 375-630 | <375 |

FIG. 4

| I2S rate | PLL clock prescaler |
|---|---|
| 8.0kHz | 12 |
| 11.025 or 12.0kHz | 8 |
| 16.0kHz | 6 |
| 22.05 or 24.0kHz | 4 |
| 32.0kHz | 3 |
| 44.1 or 48.0kHz | 2 |
| 88.2 or 96.0kHz | 1 |

DIGITAL CONTROLLER FOR AUTOMATIC RATE DETECTION AND TRACKING OF AUDIO INTERFACE CLOCKS

This application claims benefit to U.S. Provisional Application Ser. No. 61/278,645, filed on Oct. 8, 2009, which is commonly owned, and is incorporated by reference in its entirety.

BACKGROUND OF THE INVENTION (1.) Field of the Invention

This invention relates generally to digital audio COder-DECoders (CODECs) and relates more specifically to synchronization of a master clock with digital audio signals coming from separate clock domains.

(2.) Description of the Prior Art

Digital audio CODECs typically use a stable master clock as a reference and a phase-locked loop (PLL) to generate the frequencies required for processing the audio data. When used in slave mode, these devices may also be required to maintain synchronization with digital audio signals coming from a separate clock domain, These signals will not be synchronous to the master clock and they may also drift with respect to the master clock. In a complex system with a multiplicity of data sources, the signal frequencies may also change depending on the source. The slave device must therefore be capable of tracking a range of incoming data streams so that audio signal samples are not lost.

Current systems require knowledge of the incoming audio data rate so that an appropriate "gearing ratio" can be selected. This requires some form of handover protocol when switching between audio sources and precludes either switching between audio sources on the fly or switching to an unknown audio source.

It is a challenge for the designers of CODECs to achieve systems capable to automatically detecting a change in data-rate, selecting the correct gearing ratio, and re-establishing synchronization with the new audio source, There are known patents or patent publications dealing with synchronization with digital audio/video sources.

U.S. Patent Publication (US 2008/0198958 to Shin) proposes an apparatus and method for compensating for a phase jump of a reference signal in a digital Phase-Locked Loop (PLL)/Frequency-Locked Loop (FLL). The apparatus includes a phase discriminator for comparing a phase of an external clock signal (i.e., the reference signal) with a phase of an internal clock signal to determine a phase difference between the two signals, a phase jump compensator, and for correcting the phase difference by using a phase jump correction value obtained in the estimation process, and a Low Pass Filter (LPF) for filtering a high-frequency component of the corrected phase difference.

U.S. Pat. No. 7,499,106 to Gudmunson et al. discloses a method and system for synchronizing video information derived from an asynchronously sampled video signal providing a mechanism for using asynchronous sampling in the front-end of digital video capture systems. A ratio between the sampling clock frequency and the source video clock frequency is computed via an all digital phase-lock loop (ADPLL) and either a video clock is generated from the ratio by another PLL, a number to clock converter or the ratio is used directly to provide digital synchronization information to downstream processing blocks. A sample rate converter (SRC) is provided in an interpolator that either acts as a sample position corrector at the same line rate as the received video, or by introducing an offset in the ADPLL, the video data can be converted to another line rate via the SRC.

U.S. Pat. No. 5,790,615 to Beale et al. describes a digital phase-lock loop network that provides input and output clock signals to a digital data receiving system generally, and particularly to a data buffer contained therein. The digital phase-lock loop network provides bit-clock synchronization using a fixed input clock and an output clock having a variable frequency that is adjusted to correspond to the average input rate of the data samples into the data buffer. The digital phase-lock loop network allows the data buffer to be operated as a temporary storage device maintaining a nominal number of data samples therein at all times by avoiding any overflow and underflow data handling conditions that may otherwise cause loss of data. The digital phase-lock loop network of the present invention is particularly suited for the Eureka-147 system, which has become a worldwide standard for digital audio broadcasting (DAB) technology.

Furthermore U.S. Patent Publication (US 2008/0075152 to Melanson) teaches a hybrid analog/digital phase-lock loop with high-level event synchronization providing a mechanism for generating a low-jitter clock from a timing reference that has a high jitter level and synchronizing the output clock to high-level events. A numerically-controlled analog oscillator provides a clock output and a counter divides the frequency of the clock output to provide input to a digital phase-frequency detector for detecting an on-going phase-frequency difference between the timing reference and the output of the counter. A synchronization circuit detects or receives a high-level event signal, and resets the on-going phase-frequency difference and optionally the counter to synchronize the clock output with the events.

SUMMARY OF THE INVENTION

A principal object of the present invention is to achieve systems and methods capable to automatically detecting a change in data-rate, selecting the correct gearing ratio, and re-establishing synchronization with the new audio source, A further object of the invention is to remove the need for a handover procedure when switching between audio sources A further object of the invention is to enabling a system to switch between audio data sources of unknown rates.

A further object of the invention is to achieve a system for the automatic rate detection and tracking of digital data streams.

A further object of the invention is to achieve a system, which applies in particular to a digital audio interface that operates at a number of well-defined and well-spaced rates, but could be applied to other similar systems.

A further object of the invention is to remove the need to know or communicate in advance the rate at which the interface will be operating, so allowing asynchronous switching between different audio data streams.

Moreover an object of the invention is to track deviations and drift between actual and ideal rate of date streams.

In accordance with the objects of this invention a method for a digital audio interface, which doesn't require a handover procedure when switching between audio sources and allowing to switch between audio data sources of unknown rates, has been achieved. The method invented comprises the steps of: (1) providing a digital controller that works in conjunction with a first PLL, (2) using a I2S protocol comprising a data signal and at least two clock signals, wherein a first clock is used as a sampling clock for a data signal and a second clock is used to define word boundaries, and (3) detecting automatically an incoming I2S rate by completely determining a correct group of rates. Furthermore the method invented comprises the steps of (4) synchronizing both clocks by the digital controller by computing an offset deltax that is applied to a nominal feedback divide ratio of the first PLL, wherein said deltax is computed based on a current phase error and its derivative, and (5) minimizing a phase error between the first clock and the second clock by deploying the digital controller as another phase-lock loop that modifies a feedback divide ratio of the first PLL.

In accordance with the objects of this invention a digital audio interface, using an I2S protocol, without the need for a handover procedure when switching between audio sources, has been achieved. The audio interface invented comprises a fractional-N loop PLL, used to derive a device clock from a master clock, and a digital tracking controller, acting itself as a phase-lock loop by modifying a feedback divide ratio of the fractional-N loop PLL in order to minimize a phase error between the device clock and an arbitrary audio interface clock, having inputs and an output, wherein a first input is a nominal divide ratio, a second input is a I2S word clock, a third input is a lock detect signal from the fractional-N loop PLL, and a fourth input is a fractional-N signal from the fractional-N loop PLL, and the output is an offset deltax signal applied to a nominal feedback divide ratio of the fractional-N loop PLL in order to achieve a lock between the device clock and the I2S word clock.

BRIEF DESCRIPTION OF THE DRAWINGS

In the accompanying drawings forming a material part of this description, there is shown:

FIG. 3 shows in a table DIFFERENCE register values used to automatically detect and decode an I2S rate change.

FIG. 4 illustrates in a table PLL clock prescaler values for I2S settings.

DESCRIPTION OF THE PREFERRED EMBODIMENTS

Systems and methods for a digital controller for automatic rate detection and tracking of audio interface clocks are disclosed.

A digital audio interface uses a protocol known as Inter-IC Sound (I2S, which consists of (at a minimum)) two clock signals and a data signal. The first clock ("bit" clock) is used as a sampling clock for the data signal. The second clock ("word" clock) or "LR" clock) is used to define the word boundaries and can also be used to split the data between left and right audio channels. All that is significant here is that the I2S word clock runs at the sample rate of the audio data, e.g. for 44.1 kilo samples per second (ksps) CD audio data the I2S word clock runs at 44.1 kHz. The I2S word clock is simply referred to as the I2S clock in the remainder of the description.

The present invention comprises a digital controller that works with a phase-lock loop (PLL). The PLL is a fractional-N loop, used to derive the device clock from the master clock. The digital controller itself acts as a phase-lock loop by modifying the feedback divide ratio of the PLL in order to minimize the phase error between the device clock and an arbitrary audio interface clock.

Figure 1:
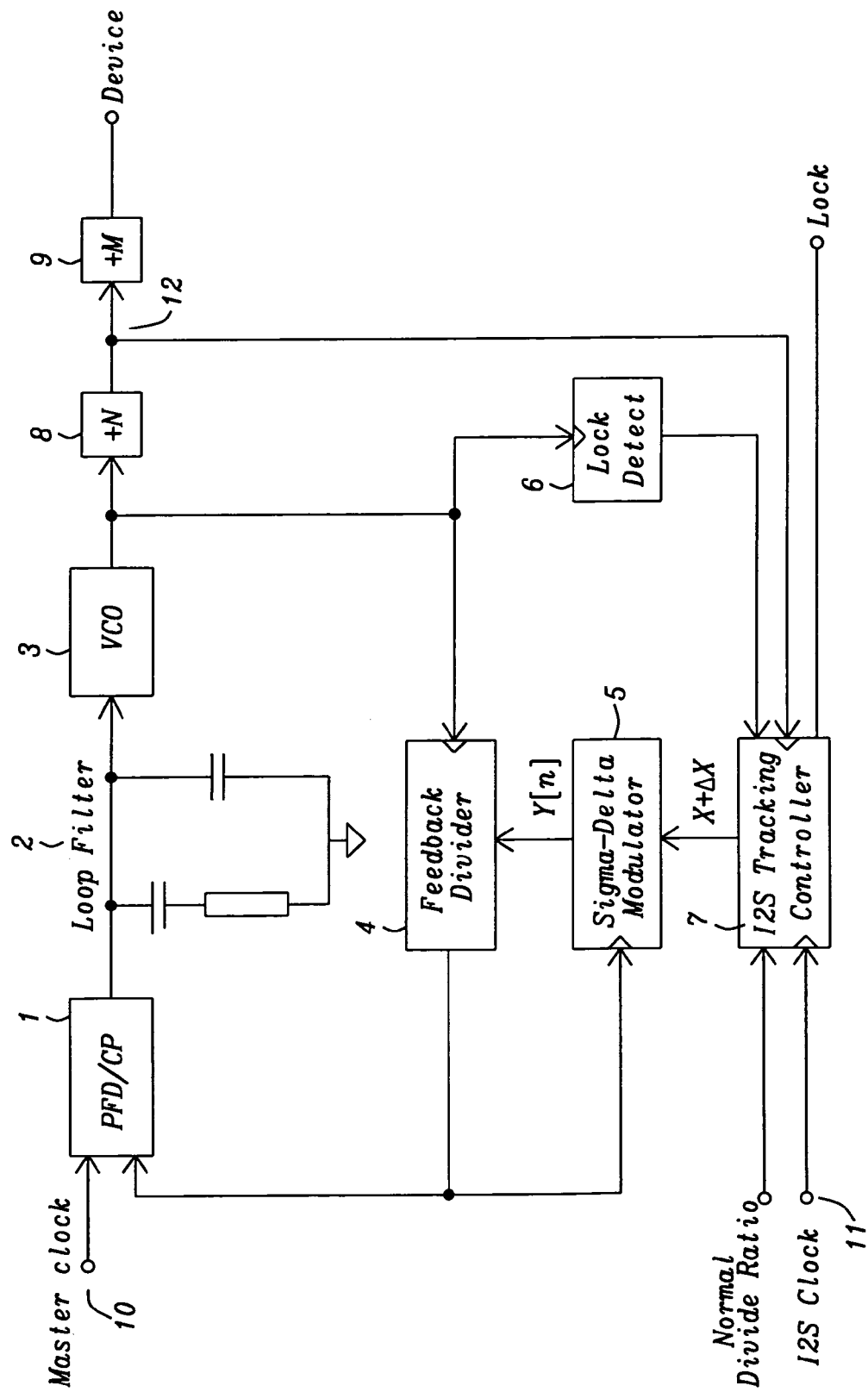
FIG. 1 illustrates an overall block diagram of a digital I2S tracking controller and analog phase-lock loop.

FIG. 1 illustrates an overall block diagram of a digital I2S tracking controller and analog phase-lock loop. The PLL comprises a phase frequency detector/charge pump unit (PFD/CP) 1, a loop filter 2, a voltage controlled oscillator (VCO) 3, a feedback divider 4, a Sigma-Delta Modulator 5, a Lock-Detect Unit 6, and the I2S tracking controller 7. The PLL clock frequency 11 is part of the inputs to the I2S tracking controller 7.

The PLL is a fractional-N loop and the frequency of the VCO 3 is reduced by a division by a factor N in a first frequency reduction block 8. In a second frequency reduction block 9 the frequency of the VCO 3, which has already been reduced in block 8, is further reduced by factor M to accommodate to the frequency required by the device clock. In the preferred embodiment N=4 and M=8 since the I2S tracking controller requires a faster clock than the device clock. Other values of N and M could be chosen for this and other systems.

When the system is in lock, the VCO clock 3 is phase locked to the master clock 10 and is also phase-locked to the I2S clock 11. In order to keep the overall system stable, the I2S tracking controller 7 operates with a much lower bandwidth than the analog PLL.

Figure 2:
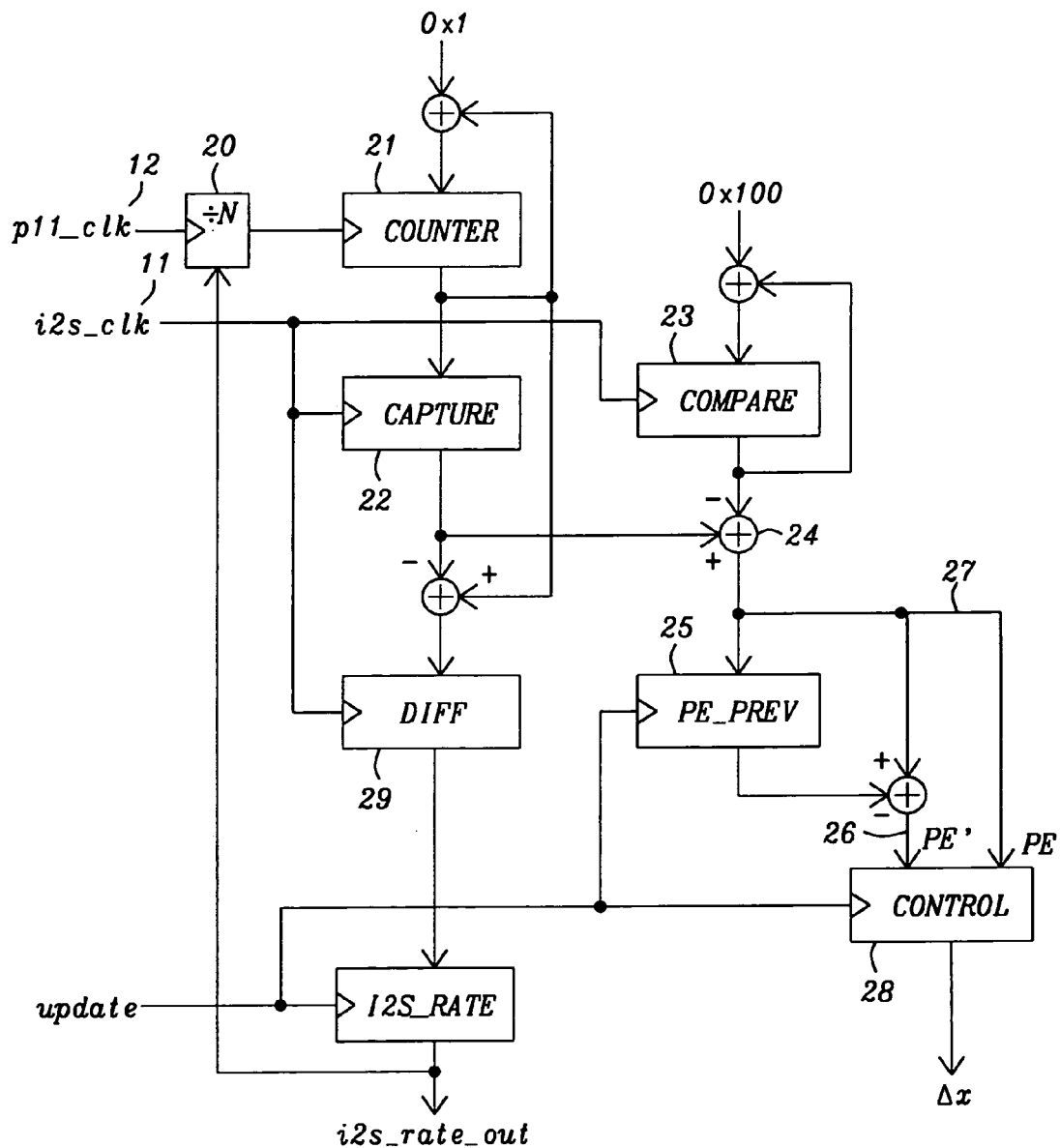
FIG. 2 shows an internal block diagram of the I2S tracking controller

FIG. 2 shows an internal block diagram of the I2S tracking controller 7. The clock from the analog PLL is divided by a prescaler 20, to reduce the high frequency PLL signal 12 to a lower frequency by integer division, and used to increment the COUNTER register 21 by 1. The I2S clock 11 is used to transfer the COUNTER 21 contents to the CAPTURE 22 block and to increment the COMPARE register 23 by 256 (0×100). COMPARE register 23 is subtracted from CAPTURE 22 by unit 24 to calculate the phase error (PE) 27, and this together with its derivative PE' 26, gained from block PREVIOUS PE 25, is fed into the CONTROL block 28. Once every update cycle, the CONTROL block 28 computes the offset "deltax", as shown in FIG. 1 the X+ΔX input to the Sigma-Delta Modulator 5, that should be applied to the nominal feedback divide ratio of the analog PLL. When the I2S tracking controller 7 is locked, the update cycle runs at approximately 10 Hz to avoid producing audible artifacts.

When the system has achieved synchronization with the I2S clock 11, the phase error will be zero, which implies that there are exactly 256 (prescaled) PLL clock 12 cycles per I2S clock 11 cycles. The Controller 28 could also be designed alternatively for other numbers of PLL clock cycles per I2S clock cycles, e.g., 128, 512, or others. A PLL clock cycle per I2S clock cycles of 256 is a preferred number of cycles as a good compromise between frequency resolution and power consumption.

The automatic detection of the I2S rate exploits the fact that there are only a limited number of valid I2S rates, e.g. 8 kHz, 44.1 kHz, etc. On each I2S cycle the DIFFERENCE register 28 records by how much the CAPTURE register 22 has changed. When the system is in synchronization the DIFFERENCE register 29 should always contain the value 256. If this value does not equal 256, it can indicate that the incoming I2S rate has changed and, together with the current I2S rate, it can be used to compute the new I2S rate.

The DIFFERENCE register 29 values used to automatically detect and decode an I2S rate change are shown in the table of FIG. 3. Once the new I2S rate has been decoded, the PLL clock prescaler 20 can be updated according to the table of FIG. 4, showing PLL clock prescaler values for I2S rate settings.

As the table of FIG. 3 shows, the I2S tracking controller 7 is unable to distinguish between (for example) 44.1 kHz and 48.0 kHz, and it uses the same internal settings for both. However the analog PLL should lock to one VCO 3 frequency for all 48.0 kHz rates (8.0, 12.0, 16.0, 24.0, 32.0, 48.0 and 96.0 kHz) and another VCO frequency for all 44.1 kHz rates (11.025, 22.05, 44.1 and 88.2 kHz). By setting the nominal divide ratio (see FIG. 1) such that the nominal VCO frequency is mid-way between the 48.0 kHz and 44.1 kHz settings, the sign of the "deltax" correction applied by the I2S tracking controller 7 to the sigma-delta modulator 5 can be used to distinguish between the two groups of rates. This allows the controller to completely determine the incoming I2S rate, and this information can be used by the rest of the system to select appropriate settings.

It is obvious that the digital controller can not only distinguish between 44.1 kHz and 48.0 kHz as shown above but also for other different I2S rates, having the same internal settings, such as 11.025 kHz and 12.0 kHz, or 22.05 kHz and 24.0 kHz, etc as shown in the table of FIG. 3. In summary, the correct group of I2S rates is determined by the digital controller by setting a nominal divide ratio such that a nominal frequency of a VCO of the first PLL is set mid-way between an upper and a lower end of a determined I2S rate group, having both common internal settings, and a sign of a correction applied to the first PLL is used to distinguish between both groups of rates. The PLL only ever locks the VCO to one of two frequencies, one for the 44.1 kHz group of rates (11.025, 22.05, 44.1, 88.2 kHz) and one for the 48 kHz group of rates (8, 12, 16, 24, 32, 48, 96 kHz). So the nominal mid-way divide ratio is the same for all I2S rates—it is only determined by the master clock frequency 10.

Figure 5:
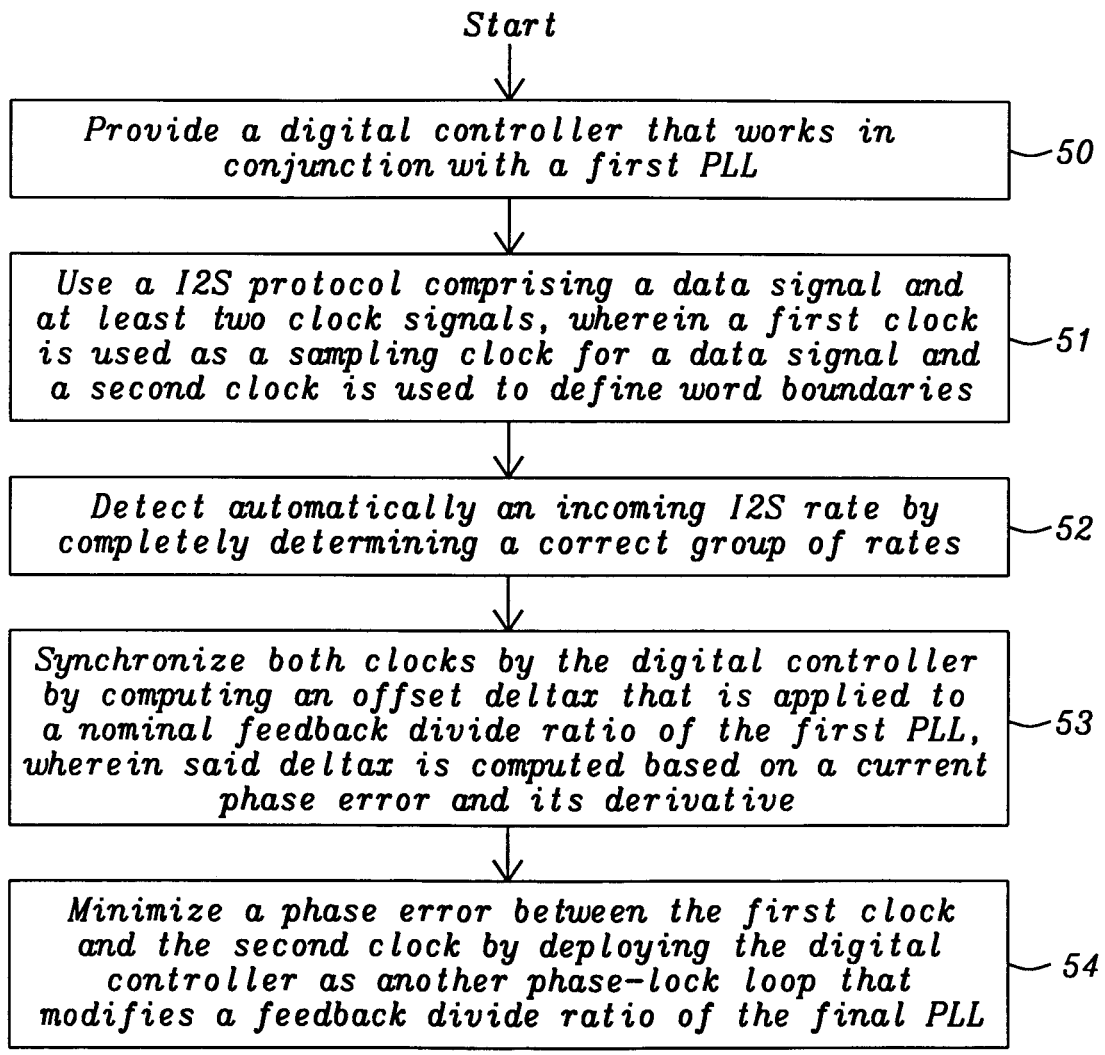
FIG. 5 illustrates a flowchart of a method invented for a digital audio interface, which doesn't require a handover procedure when switching between audio sources and allowing to switch between audio data sources of unknown rates.

FIG. 5 illustrates a flowchart of a method invented for a digital audio interface, which doesn't require a handover procedure when switching between audio sources and allowing to switch between audio data sources of unknown rates. A first step 50 describes the provision of a digital controller that works in conjunction with a first phase-lock loop. A next step 51 illustrates using an I2S protocol comprising a data signal and at least two clock signals, wherein a first clock is used as a sampling clock for a data signal and a second clock is used to define word boundaries. Step 52 describes detecting automatically an incoming I2S rate by completely determining a correct group of rates. Step 53 teaches synchronizing both clocks by the digital controller by computing an offset deltax that is applied to a nominal feedback divide ratio of the first PLL, wherein said deltax is computed based on a current phase error and its derivative. Step 54 discloses minimizing a phase error between the first clock and the second clock by deploying the digital controller as another phase-lock loop that modifies a feedback divide ratio of the first PLL.

While the invention has been particularly shown and described with reference to the preferred embodiments thereof, it will be understood by those skilled in the art that various changes in form and details may be made without departing from the spirit and scope of the invention.

What is claimed is:

1. A method for a digital audio interface, which doesn't require a handover procedure when switching between audio sources and allowing to switch between audio data sources of unknown rates, comprising the following steps:
   (1) providing a digital tracking controller that works in conjunction with a first fractional-N loop PLL, which derives a device clock from a master clock;
   (2) using an I2S protocol comprising a data signal and at least two clocks, wherein a first clock is used as a sampling clock for the data signal and a second clock is used as an I2S word clock to define word boundaries;
   (3) automatically detecting an incoming I2S rate by completely determining a correct group of I2S rates, wherein said correct group of I2S rates is determined by the digital tracking controller by setting a feedback divide ratio such that a nominal frequency of a VCO of the first PLL is set mid-way between an upper end and a lower end of a determined I2S rate group, wherein the upper end and the lower end of the determined I2S rate group have common internal settings, and a sign of a correction applied to the first PLL is used to distinguish between both upper end and lower end groups of rates;
   (4) synchronizing the first and second clocks by the digital tracking controller by computing an offset deltax signal that is applied to the feedback divide ratio of the first PLL, wherein said offset deltax signal is computed based on a current phase error between the master clock and the I2S word clock and its derivative; and
   (5) minimizing a phase error between the first clock and the second clock by deploying the digital tracking controller as another PLL that modifies the feedback divide ratio of the first PLL.

2. The method of claim 1 wherein said digital tracking controller operates with a much lower bandwidth than the first PLL.

3. The method of claim 1 wherein an operation of said digital tracking controller comprises steps of:
   (4a) dividing the device clock of the first PLL by a prescaler and using the result to increase a counter register by 1;
   (4b) transferring the content of the counter register to a capture register and increasing a compare register by a defined number using the I2S word clock;
   (4c) calculating the current phase error between the master clock and the I2S word clock by subtracting the value of the compare register from the value of the capture register and feeding the current phase error together with its derivative into a control block; and
   (4d) computing said offset deltax signal by the control block and applying said offset deltax signal to said feedback divide ratio to the first PLL.

4. The method of claim 3 wherein the control block computes said offset deltax signal correspondent to an update cycle.

5. The method of claim 4 wherein said update cycle runs at approximately 10 Hz when said control block is locked.

6. The method of claim 3 wherein said defined number is 256.

7. A digital audio interface, using an I2S protocol, without the need for a handover procedure when switching between audio sources comprises:
   a fractional-N loop PLL, used to derive a device clock from a master clock; and
   a digital tracking controller, acting itself as a phase-lock loop by modifying a feedback divide ratio of the fractional-N loop PLL in order to minimize a phase error between the device clock and an arbitrary audio interface clock, having inputs and an output, wherein a first input is a nominal divide ratio, a second input is an I2S word clock, a third input is a lock detect signal from the fractional-N loop PLL, and a fourth input is a fractional-N signal from the fractional-N loop PLL, and the output is an offset deltax signal applied to the feedback divide ratio of the fractional-N loop PLL in order to achieve a lock between the device clock and the I2S word clock.

8. The digital audio interface of claim 7, wherein said fractional-N loop PLL comprises:

a phase frequency detector and charge pump unit, a loop filter, a voltage controlled oscillator (VCO), and a feedback divider block, the phase frequency detector and charge pump unit having inputs and an output, wherein a first input receives signals from the master clock, a second input receives a feedback signal from the feedback divider block and the output generates a signal to the loop filter, wherein the loop filter generates a filter signal to the VCO, wherein the VCO generates an oscillation signal to a frequency reduction block, to a lock detect block, and to the feedback divider block, wherein the feedback divider block receives a signal from a sigma-delta modulator, wherein the frequency reduction block reduces the frequency of the oscillator signal by a factor N, wherein the lock detect block detects a lock of the device clock and the I2S word clock, and wherein the sigma-delta modulator receives inputs from the feedback divider block and the digital tracking controller and provides an output signal to the feedback divider block.

9. The digital audio interface of claim 7, wherein said digital tracking controller operates with a much lower bandwidth than the fractional-N loop PLL.

10. The digital audio interface of claim 7, wherein said digital tracking controller comprises:

a prescaler configured to prescale the device clock from the fractional-N loop PLL to generate a prescale signal, wherein an output of the prescaler is connected to a counter;

the counter configured to generate a count value, wherein an output of the counter is connected to a capture register;

the capture register configured to generate a capture signal, wherein an output of the capture register is connected to a difference register;

the difference register configured to register the capture signal based on the I2S word clock, wherein an output of the difference register is connected to an I2S rate register;

the I2S rate register configured to update the prescaler, wherein an output of the I2S rate register is connected to a control block and to a phase error register;

a compare register, which is driven by said I2S word clock in order to be increased by a digital value and whose content is subtracted from the capture register to generate a phase error to the control block; and the phase error register, which calculates a derivative of a current phase error and provides the derivative to said control block, wherein the control block provides the offset deltax signal to the feedback divide ratio to the fractional-N loop PLL.

11. The digital audio interface of claim 10, wherein the device clock from said fractional-N loop PLL is divided by said prescaler and used to increase said counter by one.

12. The digital audio interface of claim 10, wherein the I2S word clock is used to transfer the count value of said counter to said capture register and to increase said compare register by said digital value.

13. The digital audio interface of claim 12, wherein said digital value corresponds to 256.

* * * * *